(12) United States Patent
Naughton et al.

(10) Patent No.: US 7,623,746 B2
(45) Date of Patent: Nov. 24, 2009

(54) NANOSCALE OPTICAL MICROSCOPE (75) Inventors: Michael J. Naughton, Norwood, MA (US); Krzysztof J. Kempa, Billerica, MA (US); Zhifeng Ren, Newton, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 496 days.

(21) Appl. No.: 11/509,519

(22) Filed: Aug. 24, 2006

(65) Prior Publication Data

US 2007/0138376 A1 Jun. 21, 2007

Related U.S. Application Data

(60) Provisional application No. 60/711,003, filed on Aug. 24, 2005.

(51) Int. Cl.
G01B 5/28 (2006.01)
(52) U.S. Cl. .................... 385/123; 385/902; 250/234
(58) Field of Classification Search ............... 250/234; 73/105; 324/638, 690, 754; 385/123, 142, 385/902
See application file for complete search history.

(56) References Cited

U.S. PATENT DOCUMENTS

| | | |
|---|---|---|
| 3,312,870 A | 4/1967 | Rhoades |
| 3,711,848 A | 1/1973 | Martens .................. 340/280 |
| 3,990,914 A | 11/1976 | Weinstein et al. ............ 136/89 |
| 4,105,470 A | 8/1978 | Skotheim .................. 136/89 SJ |
| 4,197,142 A | 4/1980 | Bolton et al. ............ 136/89 SJ |
| 4,360,703 A | 11/1982 | Bolton et al. ................ 136/263 |
| 4,445,050 A | 4/1984 | Marks .................. 307/145 |
| 4,445,080 A | 4/1984 | Curtiss .................. 318/798 |
| 4,774,554 A | 9/1988 | Dentai et al. ................ 357/17 |
| 4,783,605 A | 11/1988 | Tomisawa et al. ........... 307/450 |
| 4,803,688 A | 2/1989 | Lawandy .................. 372/21 |
| 4,854,876 A | 8/1989 | Heath et al. .................. 434/29 |
| 4,886,555 A | 12/1989 | Hackstein et al. ........... 136/255 |
| 4,913,744 A | 4/1990 | Hoegl et al. ................ 136/244 |
| 5,009,958 A | 4/1991 | Yamashita et al. ........ 428/411.1 |
| 5,028,109 A | 7/1991 | Lawandy .................. 350/96.12 |

(Continued)

FOREIGN PATENT DOCUMENTS

EP 1507298 2/2005
WO WO 03/016901 2/2003

OTHER PUBLICATIONS

Interantional Search Report based on PCT/US06/33023 dated Jul. 31, 2007.

(Continued)

*Primary Examiner*—Kiet T Nguyen
(74) *Attorney, Agent, or Firm*—Greenberg Traurig, LLP; David J. Dykeman; Joanna T. Brougher (57) ABSTRACT

Nanoscale optical probes for use with nanoscale optical microscopy are disclosed herein. A nanoscale optical probe for use with a near-field scanning optical microscope includes an inner conductor having a top end, a bottom end, and a body; a dielectric material engaging the inner conductor; and an outer conductor engaging the dielectric material, wherein the inner conductor is longer at a tip surface of the probe than the dielectric material and the outer conductor.

20 Claims, 5 Drawing Sheets

U.S. PATENT DOCUMENTS

| | | | |
|---|---|---|---|
| 5,084,365 A | 1/1992 | Gratzel et al. | 429/111 |
| 5,105,305 A | 4/1992 | Betzig et al. | 359/368 |
| 5,157,674 A | 10/1992 | Lawandy | 372/22 |
| 5,171,373 A | 12/1992 | Hebard et al. | 136/252 |
| 5,185,208 A | 2/1993 | Yamashita et al. | 428/411.1 |
| 5,211,762 A | 5/1993 | Isoda et al. | 136/263 |
| 5,233,621 A | 8/1993 | Lawandy | 372/22 |
| 5,250,378 A | 10/1993 | Wang | 430/83 |
| 5,253,258 A | 10/1993 | Lawandy | 372/22 |
| 5,264,048 A | 11/1993 | Yoshikawa et al. | 136/263 |
| 5,267,336 A | 11/1993 | Sriram et al. | 385/2 |
| 5,272,330 A | 12/1993 | Betzig et al. | 250/216 |
| 5,291,012 A | 3/1994 | Shimizu et al. | 250/216 |
| 5,331,183 A | 7/1994 | Sariciftci et al. | 257/40 |
| 5,332,910 A | 7/1994 | Haraguchi et al. | 257/13 |
| 5,333,000 A | 7/1994 | Hietala et al. | 342/368 |
| 5,360,764 A | 11/1994 | Celotta et al. | 437/173 |
| 5,380,410 A | 1/1995 | Sawaki et al. | 204/130 |
| 5,383,038 A | 1/1995 | Lawandy | 359/7 |
| 5,434,878 A | 7/1995 | Lawandy | 372/43 |
| 5,437,736 A | 8/1995 | Cole | 136/259 |
| 5,448,582 A | 9/1995 | Lawandy | 372/42 |
| 5,479,432 A | 12/1995 | Lawandy | 372/102 |
| 5,481,630 A | 1/1996 | Lawandy | 385/16 |
| 5,489,774 A | 2/1996 | Akamine et al. | 250/234 |
| 5,493,628 A | 2/1996 | Lawandy | 385/122 |
| 5,524,011 A | 6/1996 | Lawandy | 372/22 |
| 5,547,705 A | 8/1996 | Fukuzawa et al. | 427/162 |
| 5,548,113 A | 8/1996 | Goldberg et al. | 250/234 |
| 5,585,962 A | 12/1996 | Dixon | 359/328 |
| 5,589,235 A | 12/1996 | Ogawa | 428/1 |
| 5,604,635 A | 2/1997 | Lawandy | 359/620 |
| 5,625,456 A | 4/1997 | Lawandy | 356/376 |
| 5,689,603 A | 11/1997 | Huth | 385/131 |
| 5,694,498 A | 12/1997 | Manasson et al. | 385/15 |
| 5,747,861 A | 5/1998 | Dentai | 257/435 |
| 5,789,742 A | 8/1998 | Wolff | 250/227.11 |
| 5,796,506 A | 8/1998 | Tsai | 359/191 |
| 5,862,286 A | 1/1999 | Imanishi et al. | 385/122 |
| 5,872,422 A | 2/1999 | Xu et al. | 313/311 |
| 5,880,461 A | 3/1999 | Spear | 250/208.2 |
| 5,888,371 A | 3/1999 | Quate | 205/122 |
| 5,894,122 A | 4/1999 | Tomita | 250/234 |
| 5,897,945 A | 4/1999 | Lieber et al. | 428/323 |
| 5,902,416 A | 5/1999 | Kern et al. | 136/244 |
| 5,973,444 A | 10/1999 | Xu et al. | 313/309 |
| 5,994,691 A | 11/1999 | Konada | 250/234 |
| 6,038,060 A | 3/2000 | Crowley | 359/328 |
| 6,043,496 A | 3/2000 | Tennant | 250/492.1 |
| 6,052,238 A | 4/2000 | Ebbesen et al. | 359/738 |
| 6,083,843 A | 7/2000 | Ohja et al. | 438/710 |
| 6,096,496 A | 8/2000 | Frankel | 435/4 |
| 6,100,525 A | 8/2000 | Eden | 250/338.1 |
| 6,146,227 A | 11/2000 | Mancevski | 445/24 |
| 6,183,714 B1 | 2/2001 | Smalley et al. | 423/447.3 |
| 6,194,711 B1 | 2/2001 | Tomita | 250/234 |
| 6,201,242 B1 | 3/2001 | Eden et al. | 250/332 |
| 6,211,532 B1 | 4/2001 | Yagi | 257/40 |
| 6,212,292 B1 | 4/2001 | Soares | 382/141 |
| 6,233,045 B1 | 5/2001 | Suni et al. | 356/28.5 |
| 6,258,401 B1 | 7/2001 | Crowley | 427/126.3 |
| 6,271,130 B1 | 8/2001 | Rajh et al. | 438/677 |
| 6,278,231 B1 | 8/2001 | Iwasaki et al. | 313/310 |
| 6,278,809 B1 | 8/2001 | Johnson et al. | 385/12 |
| 6,310,583 B1 | 10/2001 | Saunders | 343/786 |
| 6,322,938 B1 | 11/2001 | Cohn | 430/8 |
| 6,337,477 B1 | 1/2002 | Shimada et al. | 250/216 |
| 6,365,466 B1 | 4/2002 | Krivokapic | 438/283 |
| 6,410,935 B1 | 6/2002 | Rajh et al. | 257/43 |
| 6,415,082 B1 | 7/2002 | Wach | 385/39 |
| 6,445,006 B1 | 9/2002 | Brandes et al. | 257/76 |
| 6,456,423 B1 | 9/2002 | Nayfeh et al. | 359/328 |
| 6,472,594 B1 | 10/2002 | Ichinose et al. | 136/256 |
| 6,514,771 B1 | 2/2003 | Seul | 436/518 |
| 6,515,274 B1 | 2/2003 | Moskovits et al. | 250/216 |
| 6,569,575 B1 | 5/2003 | Biebuyck et al. | 430/5 |
| 6,621,079 B1 | 9/2003 | Shao et al. | 250/306 |
| 6,642,129 B2 | 11/2003 | Liu et al. | 438/496 |
| 6,668,628 B2 | 12/2003 | Hantschel et al. | 73/105 |
| 6,700,550 B2 | 3/2004 | Crowley | 343/792.5 |
| 6,724,064 B2 | 4/2004 | Watanabe et al. | 257/459 |
| 6,749,827 B2 | 6/2004 | Smalley et al. | 423/447.3 |
| 6,756,025 B2 | 6/2004 | Colbert et al. | 423/447.3 |
| 6,782,154 B2 | 8/2004 | Zhao et al. | 385/16 |
| 6,824,755 B2 | 11/2004 | Colbert et al. | 423/447.1 |
| 6,833,162 B2 | 12/2004 | Chattopadhyay et al. | 427/273 |
| 6,835,534 B2 | 12/2004 | Weiss et al. | 430/311 |
| 6,861,648 B2 | 3/2005 | Kley | 250/306 |
| 6,867,443 B2 | 3/2005 | Liu et al. | 257/226 |
| 6,882,051 B2 | 4/2005 | Majumdar et al. | 257/746 |
| 6,891,623 B1 | 5/2005 | Baudon et al. | 356/491 |
| 6,897,158 B2 | 5/2005 | Sharma | 438/713 |
| 6,913,713 B2 | 7/2005 | Chittibabu et al. | 252/501.1 |
| 6,936,233 B2 | 8/2005 | Smalley et al. | 423/447.1 |
| 6,949,237 B2 | 9/2005 | Smalley et al. | 423/447.3 |
| 6,959,481 B2 * | 11/2005 | Moreland et al. | 29/592.1 |
| 6,969,897 B2 | 11/2005 | Kim, II | 257/432 |
| 6,979,709 B2 | 12/2005 | Smalley et al. | 524/495 |
| 6,985,223 B2 | 1/2006 | Drachev et al. | 356/301 |
| 6,996,147 B2 | 2/2006 | Majumdar et al. | 372/43 |
| 7,005,378 B2 | 2/2006 | Crocker, Jr. et al. | 438/674 |
| 7,008,604 B2 | 3/2006 | Smalley et al. | 423/447.1 |
| 7,013,708 B1 | 3/2006 | Cho et al. | 73/31.05 |
| 7,035,498 B2 | 4/2006 | Wu et al. | 385/16 |
| 7,041,620 B2 | 5/2006 | Smalley et al. | 502/182 |
| 7,048,903 B2 | 5/2006 | Colbert et al. | 423/447.1 |
| 7,048,999 B2 | 5/2006 | Smalley et al. | 428/367 |
| 7,052,666 B2 | 5/2006 | Colbert et al. | 423/447.1 |
| 7,053,351 B2 | 5/2006 | Li et al. | 250/201.3 |
| 7,057,832 B2 | 6/2006 | Wu et al. | 359/811 |
| 7,060,510 B2 | 6/2006 | Bonnell et al. | 438/3 |
| 7,067,098 B2 | 6/2006 | Colbert et al. | 423/447.1 |
| 7,071,406 B2 | 7/2006 | Smalley et al. | 136/252 |
| 7,097,820 B2 | 8/2006 | Colbert et al. | 423/447.2 |
| 7,115,864 B2 | 10/2006 | Colbert et al. | 250/306 |
| 7,126,183 B2 | 10/2006 | Forbes et al. | 257/314 |
| 7,129,567 B2 | 10/2006 | Kirby et al. | 257/621 |
| 7,132,711 B2 | 11/2006 | Forbes et al. | 257/314 |
| 7,151,256 B2 | 12/2006 | Guillorn et al. | 250/306 |
| 7,208,793 B2 | 4/2007 | Bhattacharyya | 257/314 |
| 7,220,962 B2 | 5/2007 | Kawakatsu | 250/306 |
| 7,473,887 B2 * | 1/2009 | Miles et al. | 250/234 |
| 2001/0001681 A1 | 5/2001 | Zhang et al. | 427/508 |
| 2002/0102196 A1 | 8/2002 | Smalley et al. | 422/198 |
| 2002/0102201 A1 | 8/2002 | Colbert et al. | 423/445 R |
| 2002/0122873 A1 | 9/2002 | Mirkin et al. | 427/2.1 |
| 2002/0150524 A1 | 10/2002 | Smalley et al. | 422/198 |
| 2002/0159943 A1 | 10/2002 | Smalley et al. | 423/447.1 |
| 2003/0021967 A1 | 1/2003 | Sagiv et al. | 428/209 |
| 2003/0068432 A1 | 4/2003 | Dai et al. | 427/58 |
| 2003/0134267 A1 | 7/2003 | Kang et al. | 435/4 |
| 2003/0182993 A1 | 10/2003 | Hantshel et al. | 73/105 |
| 2003/0213922 A1 | 11/2003 | Gordon et al. | 250/492.1 |
| 2004/0051542 A1 | 3/2004 | Miles et al. | 324/754 |
| 2004/0075464 A1 | 4/2004 | Samuelson et al. | 326/37 |
| 2004/0077156 A1 | 4/2004 | Tsakalakos et al. | 438/479 |
| 2004/0131843 A1 | 7/2004 | Mirkin et al. | 428/327 |
| 2004/0169615 A1 | 9/2004 | Crowley | 343/810 |
| 2004/0232321 A1 | 11/2004 | Miles et al. | 250/235 |
| 2004/0245209 A1 | 12/2004 | Jung et al. | 216/8 |
| 2004/0256552 A1 | 12/2004 | Kawakatsu | 250/306 |
| 2005/0017171 A1 | 1/2005 | Samuelson et al. | 250/306 |
| 2005/0103993 A1 | 5/2005 | Guillorn et al. | 250/306 |
| 2005/0181409 A1 | 8/2005 | Park et al. | 435/6 |

| | | | |
|---|---|---|---|
| 2005/0189480 A1 | 9/2005 | Hollingsworth | 250/234 |
| 2005/0191434 A1 | 9/2005 | Mirin et al. | 427/457 |
| 2005/0194035 A1 | 9/2005 | Jin et al. | 136/252 |
| 2005/0194038 A1 | 9/2005 | Brabec et al. | 136/256 |
| 2005/0199894 A1 | 9/2005 | Rinzler et al. | 257/94 |
| 2005/0211294 A1 | 9/2005 | Chittibabu et al. | 136/263 |
| 2005/0221202 A1 | 10/2005 | Gofron | 430/5 |
| 2005/0221577 A1 | 10/2005 | Li et al. | 438/401 |
| 2005/0230270 A1 | 10/2005 | Ren et al. | 205/777.5 |
| 2005/0243410 A1 | 11/2005 | Bachmann et al. | 359/342 |
| 2005/0255237 A1 | 11/2005 | Zhang et al. | 427/180 |
| 2005/0272856 A1 | 12/2005 | Cooper et al. | 254/496 |
| 2006/0014001 A1 | 1/2006 | Zhang et al. | 428/195.1 |
| 2006/0024438 A1 | 2/2006 | Ku et al. | 427/237 |
| 2006/0027543 A1 | 2/2006 | Cheng | 219/121.69 |
| 2006/0040057 A1 | 2/2006 | Sheehan et al. | 427/256 |
| 2006/0043257 A1 | 3/2006 | Cheng et al. | 250/201.3 |
| 2006/0054922 A1 | 3/2006 | Pettit | 257/116 |
| 2006/0082379 A1 | 4/2006 | Liu et al. | 324/754 |
| 2006/0110618 A1 | 5/2006 | Manivannan et al. | 428/566 |
| 2006/0158760 A1 | 7/2006 | Portico Ambrosio et al. | 359/883 |
| 2007/0047056 A1 | 3/2007 | Kempa et al. | 359/245 |
| 2007/0081242 A1 | 4/2007 | Kempa et al. | 359/486 |
| 2007/0105240 A1 | 5/2007 | Kempa et al. | 438/3 |
| 2007/0107103 A1 | 5/2007 | Kempa et al. | 977/834 |
| 2007/0137697 A1 | 6/2007 | Kempa et al. | 136/256 |
| 2007/0138376 A1 | 6/2007 | Naughton et al. | 250/216 |
| 2007/0240757 A1 | 10/2007 | Ren et al. | 136/256 |
| 2009/0045720 A1* | 2/2009 | Lee et al. | 313/503 |

OTHER PUBLICATIONS

Ambit Corporation Press Release, "AMBIT Corporation Announces Solar Energy Initiative", (4 pages) Apr. 26, 2006 at www.nanotech-now.com/news.cgi?story_id=15038, accessed on Oct. 25, 2007.

Nanotechnology News, "Carbon Nanotube Structures Could Provide More Efficient Solar Power for Soldiers", (3 pages), Oct. 15, 2007 at www.azonano.com/news.asp?newsID=58, accessed on Oct. 25, 2007.

Center for Multifunctional Polymer Nanomaterials and Devices (CMPND), "Polymer Photonics", (6 pages), © 2003 found at www.capce.ohio-state.edu/CMPND/Photonics.htm, accessed on Oct. 25, 2007.

Atwater et al., *The New "p-n Junction": Plasmonics Enables Photonic Access to the Nanoworld*, MRS Bulletin, 30 (5), pp. 385-389, ISSN 0883-7694, May 2005.

Balasubramanian et al., *Biosensors Based on Carbon Nanotubes*, Anal. Bioanal. Chem. vol. 385, pp. 452-468, 2006.

Burns, G., *Solid State Physics*, Academic Press Inc., Orlando, pp. 487-489, 1985.

Delzeit et al., *Growth of Carbon Nanotubes by Thermal and Plasma Chemical Vapour Deposition Processes and Applications in Microscopy*, Nanotechnology, vol. 13, pp. 280-284, 2002.

Evident Technologies, Inc., *Quantum Dots in High Efficiency Photovoltaics Using EviDots*, pp. 1-8, Jan. 2006.

Fumeaux et al., *Measurement of the Resonant Lengths of Infrared Dipole Antennas*, Infrared Physics and Technology, vol. 41, pp. 271-281, 2000.

Griggs et al., *P-n Junction Heterostructure Device Physics Model of a Four Junction Solar Cell*, Proceedings of SPIE, vol. 6339, pp. 63390D1-63390-D8, 2006.

Guo et al., *Metal-Insulator-Semiconductor Electrostatics of Carbon Nanotubes*, Applied Physics Letters, vol. 81, No. 8, pp. 1486-1488, Aug. 19, 2002.

Guo et al., *Performance Projections for Ballistic Carbon Nanotube Field-Effect Transistors*, Applied Physics Letters, vol. 80, No. 17, pp. 3192-3194, Apr. 29, 2002.

Heavens, O.S., *Optical Properties of Thin Solid Films*, Dover Publications, Inc., New York, pp. 113-116, 1955.

Huang et al., *Growth of Large Periodic Arrays of Carbon Nanotubes*, Applied Physics Letters, vol. 82, No. 3, pp. 460-462, Jan. 20, 2003.

Jorio et al., *Polarized Resonant Raman Study of Isolated Single-Wall Carbon Nanotubes: Symmetry Selection Rules, Dipolar and Multipolar Antenna Effects*, Physical Review B, vol. 65, pp. 121402-1-121402-4, 2002.

Kayes et al., *Comparison of the Device Physics Principles of Planar and Radial p-n Junction Nanorod Solar Cells*, Journal of Applied Physics, 97 (11), Art. No. 114302, pp. 114302-1-114302-11, 2005.

Kayes et al., *Radial pn Junction Nanorod Solar Cells: Device Physics Principles and Routes to Fabrication in Silicon*, Photovoltaic Specialists Conference 2005, Conference Record of the Thirty-Fifth Proceedings of the IEEE, pp. 55-58, Jan. 3-7, 2005.

Kempa et al., *Photonic Crystals Based on Periodic Arrays of Aligned Carbon Nanotubes*, Nano Letters, vol. 3, No. 1, pp. 13-18, 2003.

Milanovic et al., *A Simple Process for Lateral Single Crystal Silicon Nanowires*, Proceedings of IMECE'02, 2002 ASME International Engineering Congress & Exposition, New Orleans, LA, IMCE 2002-33392, pp. 1-7, Nov. 17-22, 2002.

Moon et al., *Field Theory for Engineers*, D. Van Nostrand Company Inc., Princeton, NJ, pp. 504-509, 1961.

Ren et al., *Synthesis of Large Arrays of Well-Aligned Carbon Nanotubes on Glass*, Science, vol. 282, pp. 1105-1107, Nov. 6, 1998.

Sotiropoulou et al., *Carbon Nanotube Array-Based Biosensor*, Anal. Bioanal. Chem., vol. 375, pp. 103-105, 2003.

Staebler et al., *Reversible Conductivity Changes in Discharge-Produced Amorphous Si*, Applied Physics Letters, vol. 31, No. 4, pp. 292-294, 1977.

Teo et al., *Uniform Patterned Growth of Carbon Nanotubes Without Surface Carbon*, Applied Physics Letters, vol. 79, No. 10, pp. 1534-1536, Sep. 3, 2001.

Terman, F.E., *Radio Engineering*, McGraw-Hill Book Company, New York, Chapter 14, pp. 662-731, 1947.

von Roedern, B. et al., *The Role of Polycrystalline Thin-Film PV Technologies for Achieving Mid-Term Market Competitive PV Modules*, Conference Record of 31st IEEE Photovoltaics Specialists Conference and Exhibition, Lake Buena Vista, FL, Jan. 3-7, 2005.

Wang et al., *Receiving and transmitting Light-Like Radio Waves: Antenna Effect in Arrays of Aligned Carbon Nanotubes*, Applied Physics Letters, vol. 85, No. 13, pp. 2607-2609, Sep. 27, 2004.

Yamamoto, et al., *Photoconductive Coaxial Nanotubes of Molecularly Connected Electron Donor and Acceptor Layers*, Science, vol. 314, pp. 1761-1764, Dec. 15, 2006.

* cited by examiner

NANOSCALE OPTICAL MICROSCOPE

RELATED APPLICATIONS

This application claims the benefit of U.S. Provisional Application No. 60/711,003, filed on Aug. 24, 2005, and the entire teachings of this application are incorporated herein by reference.

GOVERNMENT SUPPORT

The invention was supported, in whole or in part, by Contract No. DAAD16-02-C-0037 from the U.S. Army Natick Soldier Systems Center. The Government has certain rights in the invention.

FIELD

The embodiments disclosed herein relate to the field of microscopy, and more particularly to nanoscale optical probes for use with nanoscale optical microscopy.

BACKGROUND

Near-field scanning optical microscopy (NSOM) is a type of microscopy where a sub-wavelength light source, usually a fiber tip with an aperture smaller than 100 nm, is used as a scanning probe over a sample. Near-field scanning optical microscopy is one in a family of scanned probe techniques that includes scanning tunneling microscopy and atomic force microscopy (AFM) where an image is obtained by raster scanning a probe across a surface collecting data at an array of points during the scan. In order to achieve an optical resolution better than the diffraction limit, the scanning probe has to be brought within the near-field region (that part of the radiated field nearest to the antenna, where the radiation pattern depends on the distance from the antenna). NSOM is based upon the detection of non-propagating evanescent waves in the near-field region. The probe is scanned over a surface of the sample at a height above the surface of a few nanometers and allows optical imaging with spatial resolution beyond the diffraction limit.

The scanning probe can either detect in the near-field directly, by means of the sub-wavelength size aperture (collection mode), or by using the probe as a waveguide with a sub-wavelength scattering source and detecting the evanescent waves as they propagate into the far-field (transmission mode). The achievable optical resolution of NSOM is mainly determined by the aperture size of the scanning probe and the probe-surface gap. NSOM may, in theory, be combined with any spectroscopic technique to gather spectra from small regions of a sample. Infrared (IR), Raman, visible, and V, as well as NSOM fluorescence, photoluminescence, photoconductance, and magnetooptical (MOKE) spectroscopies have been investigated.

Prior art techniques for nanoscale optical characterization imaging have been described in U.S. Pat. No. 5,489,774 entitled "Combined Atomic Force and Near Field Scanning Optical Microscope with Photosensitive Cantilever," U.S. Pat. No. 6,985,223 entitled "Raman Imaging and Sensing Apparatus Employing Nanoantennas," and U.S. Pat. No. 7,053,351 entitled "Near-Field Scanning Optical Microscope for Laser Machining of Micro- and Nano-Structures," all of which are hereby incorporated by reference in their entireties for the teachings therein.

There is a need in the art for nanoscale optical probes that extend the measurements and standards infrastructure of conventional near-field scanning optical microscopy techniques.

SUMMARY

Nanoscale optical probes that facilitate sub-wavelength, sub-diffraction limit, and spatial resolution are disclosed herein.

According to aspects illustrated herein, there is provided a nanoscale optical probe for use with a near-field scanning optical microscope that includes an inner conductor having a top end, a bottom end, and a body; a dielectric material which surrounds the inner conductor; and an outer conductor which surrounds the dielectric material, wherein the inner conductor is longer at a tip surface of the probe than the dielectric material and the outer conductor.

According to aspects illustrated herein, there is provided a magnifying element for use with a near-field scanning optical microscope that includes a film having a top surface, a bottom surface and a plurality of cylindrical channels and an array of nanoscale optical probes penetrating the film through the plurality of cylindrical channels, wherein each nanoscale optical probe has an inner nanowire having a top end, a bottom end, and a body; a dielectric material which surrounds the inner nanowire; and an outer metal material which surrounds the dielectric material.

According to aspects illustrated herein, there is provided a method of fabricating a nanoscale optical probe having a top surface and a bottom surface that includes electrodepositing a catalytic transition metal on an optical fiber tip; growing a carbon nanotube (CNT) on the optical fiber; depositing a dielectric material over the carbon nanotube; and depositing an outer metal material over the dielectric material.

According to aspects illustrated herein, there is provided a method of fabricating a nanoscale optical probe having a top surface and a bottom surface that includes electrodepositing a catalytic transition metal on an AFM-type tip; growing a carbon nanotube (CNT) on the optical fiber; depositing a dielectric material over the carbon nanotube; and depositing an outer metal material over the dielectric material.

BRIEF DESCRIPTION OF THE DRAWINGS

The presently disclosed embodiments will be further explained with reference to the attached drawings, wherein like structures are referred to by like numerals throughout the several views. The drawings are not necessarily to scale, the emphasis having instead been generally placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The embodiments disclosed herein relate to the field of nano-optics and more particularly to nanoscale optical probes for nanoscale optical microscopy. The nanoscale optical probes of the presently disclosed embodiments facilitate sub-wavelength, sub-diffraction limit, and spatial resolution. The nanoscale optical probes have a metallic inner conductor surrounded by a dielectric or semiconducting material, which is surrounded by a second metallic coating (outer conductor). In an embodiment, the metallic inner conductor is a carbon nanotube. The following definitions are used to describe the various aspects and characteristics of the presently disclosed embodiments.

As referred to herein, "nano-optics" is the study of optical interactions with matter on a subwavelength scale, i.e., nanoscale optics.

As referred to herein, "carbon nanotube", "nanowire", and "nanorod" are used interchangeably.

As referred to herein, "nanoscale" refers to distances and features below about 5000 nanometers (one nanometer equals one billionth of a meter).

As referred to herein, CNTs are "aligned" wherein the longitudinal axis of individual tubules are oriented in a plane substantially parallel to one another.

As referred to herein, a "tubule" is an individual CNT.

As referred to herein, "array" refers to a plurality of CNT tubules that are attached to a substrate material proximally to one another.

As referred to herein, a "nanoscale coaxial line" refers to a nanoscale coaxial wire, which includes a plurality of concentric layers. In an embodiment, the nanoscale coaxial line has three concentric layers: an internal conductor, a photovoltaic coating around the core, and an outer conductor. Transmission of electromagnetic energy inside the coaxial line is wavelength-independent and happens in transverse electromagnetic (TEM) mode. In an embodiment, the internal conductor is a metallic core. In an embodiment, the outer conductor is a metallic shielding.

As referred to herein, a "nanoscale coplanar line" refers to a nanoscale coplanar structure, which includes a plurality of parallel layers. In an embodiment, the nanoscale coplanar line has three parallel layers: two metallic conductors, with a photovoltaic coating between them. Transmission of electromagnetic energy inside the coplanar line is wavelength-independent and happens in transverse electromagnetic (TEM) mode.

As referred to herein, "transverse electromagnetic (TEM)" refers to an electromagnetic mode in a transmission line for which both the electric and magnetic fields are perpendicular to the direction of propagation. Other possible modes include but are not limited to transverse electric (TE), in which only the electric field is perpendicular to the direction of propagation, and transverse magnetic (TM), in which only the magnetic field is perpendicular to the direction of propagation.

As referred to herein, a "catalytic transition metal" can be any transition metal, transition metal alloy or mixture thereof. Examples of a catalytic transition metals include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In a embodiment, the catalytic transition metal comprises nickel (Ni).

As referred to herein, a "catalytic transition metal alloy" can be any transition metal alloy. Preferably, a catalytic transition metal alloy is a homogeneous mixture or solid solution of two or more transition metals. Examples of a catalytic transition metal alloy include, but are not limited to, a nickel/gold (Ni/Au) alloy and a cobalt/iron (Co/Fe) alloy.

The terms "nanotubes," "nanowires," "nanorods," "nanocrystals," "nanoparticles" and "nanostructures" are employed interchangeably herein. These terms primarily refer to material structures having sizes, e.g., characterized by their largest dimension, in a range of a few nanometers (nm) to about a few microns. In applications where highly symmetric structures are generated, the sizes (largest dimensions) can be as large as tens of microns.

As referred to herein, "CVD" refers to chemical vapor deposition. In CVD, gaseous mixtures of chemicals are dissociated at high temperature (for example, $CO_2$ into C and $O_2$). This is the "CV" part of CVD. Some of the liberated molecules may then be deposited on a nearby substrate (the "D" in CVD), with the rest pumped away. Examples of CVD methods include but not limited to, "plasma enhanced chemical vapor deposition" (PECVD), and "hot filament chemical vapor deposition" (HFCVD).

As referred to herein, an "optical signal" refers to any electromagnetic radiation pulse including gamma rays, X-rays, ultraviolet light, visible light, infrared, microwaves, radio waves (ULF, VLF, LF, MF, HF, long, short, HAM, VHF, UHF, SHF, EHF), cosmic microwave background radiation and other forms of radiation of the electromagnetic spectrum.

As referred to herein, an "antenna" efficiently converts the energy of free-propagating radiation to localized energy, and vice versa.

A microscope is capable of imaging objects with magnification and resolution that are functions of the wavelength of the waves incident on the object. For a conventional optical microscope, these waves are electromagnetic in nature, with wavelengths in the visible range of the electromagnetic spectrum. The wavelength spectrum of visible light is about 350 nm to about 750 nm (from red to blue). As such, an optical microscope is capable of imaging objects down to approximately one micrometer (1000 nm) in size. To image smaller objects, waves of shorter wavelength are required. For example, electron waves in an electron microscope can be in the range of 1 nm, so that nanometer resolution is possible.

Visible light can be used to image objects smaller than 1 micrometer, but only using the so-called near electric field, or the "near-field". The imaging dimensions in above paragraph referred to the conventional "far field", meaning at distances from the imaged object larger than the wavelength of the incident waves. Thus, near-field optical microscopy, typically in the form of near-field scanning optical microscopy (NSOM), is a powerful optical imaging technique that allows one to achieve imaging resolution below the so-called diffraction limit using a sub-wavelength light source. This diffraction limit is defined by the Rayleigh-Abbe criterion, $d=1.22\lambda/NA$, where d is the minimum resolved image size, $\lambda$ is the wavelength of light employed, and NA is the numerical aperture of the objective lens of the imaging system.

In NSOM, a probe consisting of a small aperture on the end of a tapered, metal-coated optical fiber is scanned over a surface at a few nanometers height. By illuminating a sample with the near-field of a small light source, one can construct optical images with resolution well beyond the usual diffraction limit, and typically about 50 nm. Near-field, also known as evanescent, light does not propagate through space (far field does), but instead is localized near the surface of the point source. The resolution of NSOM depends on the size of aperture used and the distance from the point source to the sample, but not on the wavelength of light. An image is generated by irradiating a small portion of an object placed within the near-field of the aperture (tip) and raster scanning the sample. Existing NSOM probes employ this tapered optical fiber technique. The presently disclosed embodiments employ nanoscale optical probes that are configured as a coaxial cable or a planar waveguide for use in optical microscopy, and NSOM in particular.

Carbon nanotubes have unique mechanical and electronic characteristics, which make them suitable for nanomechanical and nanoelectromechanical applications, in particular nanoscale optics. Carbon nanotubes may act as antennas, but instead of transmitting and receiving radio waves, which are at the longest end of the electromagnetic spectrum, antennas of their size pick up the nanoscale wavelengths of visible light.

The presently disclosed embodiments generally relate to the use of carbon nanotubes to fabricate nanoscale optical probes. The presently disclosed nanoscale optical probes will enable far more efficient collection of photons (light), with finer spatial resolution than, and facilitates certain tunabilities that are not available in, existing NSOM systems. In an embodiment, the nanoscale optical probe may be physically attached to a conventional NSOM tapered fiber tip, and acts as an optical focusing and compressing tool to enable finer spatial resolution. That is, the mode of detection is predominantly optical (because even in conventional optical microscopy, the optical image of the object under study is routinely converted to a digital image using charged-coupled devices), and so becomes electronic as in conventional optical microscopy, including NSOM. In an embodiment, a conventional NSOM tapered fiber tip, as well as any and all optical components used to transmit the image light to a CCD or other detector, is replaced by an AFM-type (atomic force microscope) cantilever. Instead of transporting photons carrying the optical image information to a detector, the nanoscale optical probe directly converts the photons to electric current through the photovoltaic effect. That is, the nanoscale optical probe acts as a photon-to-electron converter, identically as in solar photovoltaics if a photovoltaic medium (such as silicon) is used as the dielectric. This embodiment has the advantage of simplifying the detection scheme and apparatus and may also eliminate information losses inherent in the conventional detection schemes.

In the presently disclosed embodiments, the nanoscale optical probes function as nanoscale optical microscopes by having the ability to receive and convey an optical signal with resolution smaller than the wavelength of the light. After receiving such light, the nanoscale optical probes convey the light along distances that exceed by many times the wavelength of the optical signal, thereby delivering the optical signal for readout (via standard electro-optic means, such as charge-coupled display (CCD)).

The nanoscale optical probes of the presently disclosed embodiments are able to collect photons and transport visible (or nonvisible) light, yielding the capability of increased spatial resolution for visible optics to the sub-10 nm range, at least a factor of 10 better than existing NSOM technologies.

Figure 1:
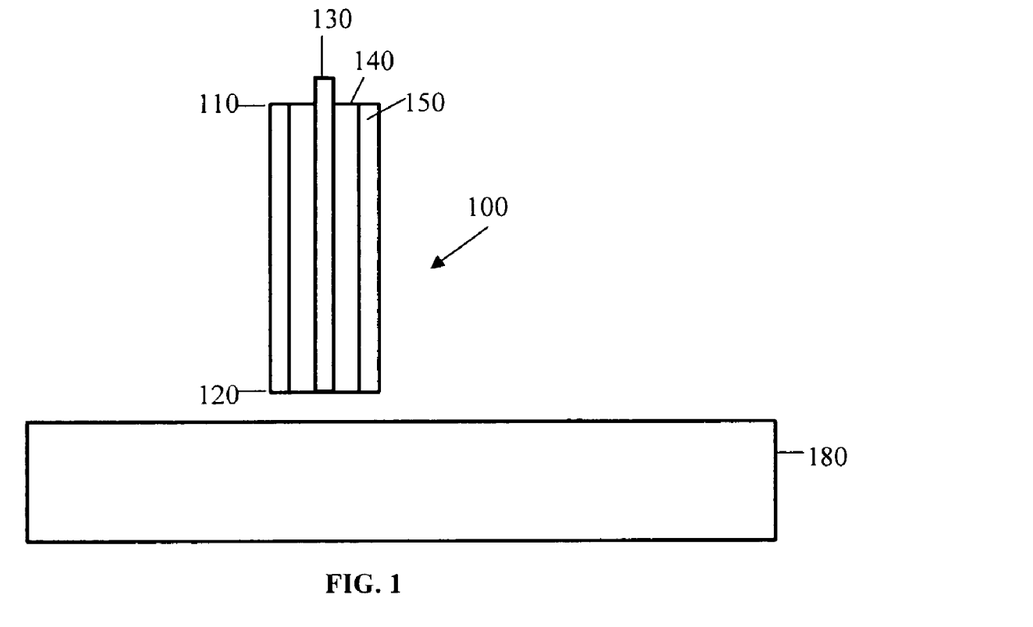
FIG. 1 shows a nanoscale optical probe in accordance with the presently disclosed embodiments.

FIG. 1 shows an embodiment of a nanoscale optical probe 100 synthesized in accordance with the presently disclosed embodiments. In the embodiment shown in FIG. 1, the nanoscale optical probe 100 is configured as a coaxial wire (nano-coax) waveguide. The nanoscale optical probe 100 has a tip surface 110 and a blunt substrate surface 120. The nanoscale optical probe 100 has a metallic inner conductor 130 having a top end, a bottom end, and a body that is cylindrically (circumferentially) surrounded by a dielectric or semiconducting material 140, which is cylindrically (circumferentially) surrounded by a second metallic coating 150 (outer conductor). In an embodiment, the metallic inner conductor 130 is a carbon nanotube. The inner conductor 130 is longer than the outer conductor 150, such that the inner conductor 130 protrudes out the tip surface 110 of the nanoscale optical probe 100. The top end and the bottom end of the inner conductor 130 act as nano-optical antennas and are capable of receiving (collecting), transmitting, and re-emitting an optical signal. Examples of dielectric coatings 140 include, but are not limited to, any dielectric material of high optical transparency such as ceramic materials: aluminum oxide ($Al_2O_3$) or silicon oxide ($SiO_x$, where $0 \leq x \leq 2$). In an embodiment, the dielectric or semiconducting material 140 is $Al_2O_3$. Examples of metallic coatings 150 include, but are not limited to aluminum (Al), copper (Cu), Gold (Au), or zinc (Zn). In an embodiment, the metallic coating 150 is aluminum.

The diameters of the three components (inner conductor 130, dielectric 140, and outer conductor 150) are all in the nanometer range. In an embodiment, the inner conductor 130 has a diameter of about 2 nm to about 200 nm. In an embodiment, the dielectric material 140 has a thickness of about 10 nm to about 200 nm. In an embodiment, the outer conductor 150 has a thickness of about 10 nm to about 200 nm.

The nanoscale optical probe 100 may concentrate, or compress, an optical signal into a sub-wavelength channel. The nanoscale optical probe 100 may project an optical signal out of a surface, and collect light from outside. The spatial variation of the electric field in the optical signal at the surface, both along the coaxial axis and transverse to the surface, depends on the relative length of the inner 130 and outer 150 conductors. A substrate 180 contains an object to be imaged. By scanning the end of the nanoscale optical probe 100, a magnified image of the object under study is collected. The nanoscale optical probe 100 will achieve resolutions of less than about 10 nm in all directions transverse and parallel to the coaxial axis.

An optical signal (electromagnetic radiation) will enter the substrate surface 120 from within a small radius or narrow volume, approximately hemispherical in shape, within the near-electromagnetic field (near-field) at the bottom end of the inner conductor 130. Thus, the configuration of the nanoscale optical probe 100 enables an optical microscope to function as a near-field optical microscope. Because the diameter of the inner conductor 130 may be significantly smaller than the wavelength of visible light, which is in the range of about 300 nm to about 700 nm, the nanoscale optical probe 100 may be used to image objects with spatial resolution well under this range. Because the inner diameter of the outer conductor 150 may also be nanoscale, and smaller than the wavelength of visible light, the nanoscale optical probe 100 may image objects with spatial resolution smaller than that of conventional near-field optical microscopes. The configuration of the nanoscale optical probe 100 serves to limit or cutoff the extent to which the sensitivity to near-field extends, independent of the wavelength of the optical signal in cases where that wavelength exceeds the outer conductor 150 diameter by compressing the electromagnetic field into a volume defined by the size of the nanoscale optical probe 100. This cutoff/compression is further enhanced by having the inner conductor 130 be not flush, or blunt, at the substrate surface 120, but rather less-than-blunt, or under cut, such that the length at the substrate surface 120 is less than that of the dielectric 140 or the outer conductor 150. This will act to further restrict the spatial extent (especially in the vertical direction, toward the object) of the sensitivity to near-electromagnetic fields, thus increasing the resolution by decreasing the area of object that constitutes one pixel. This provides a significant advantage over conventional NSOM probes, which have no such cutoff or field compression. In an embodiment, the inner conductor 130 size may be as small as a few nanometers, and the outer conductor 150 dimensions as small as about 10 nm. As in conventional NSOM, an object is imaged by scanning across the surface of the object, at a height of a few nanometers, where the sensitivity to near field light is highest.

Figure 2:
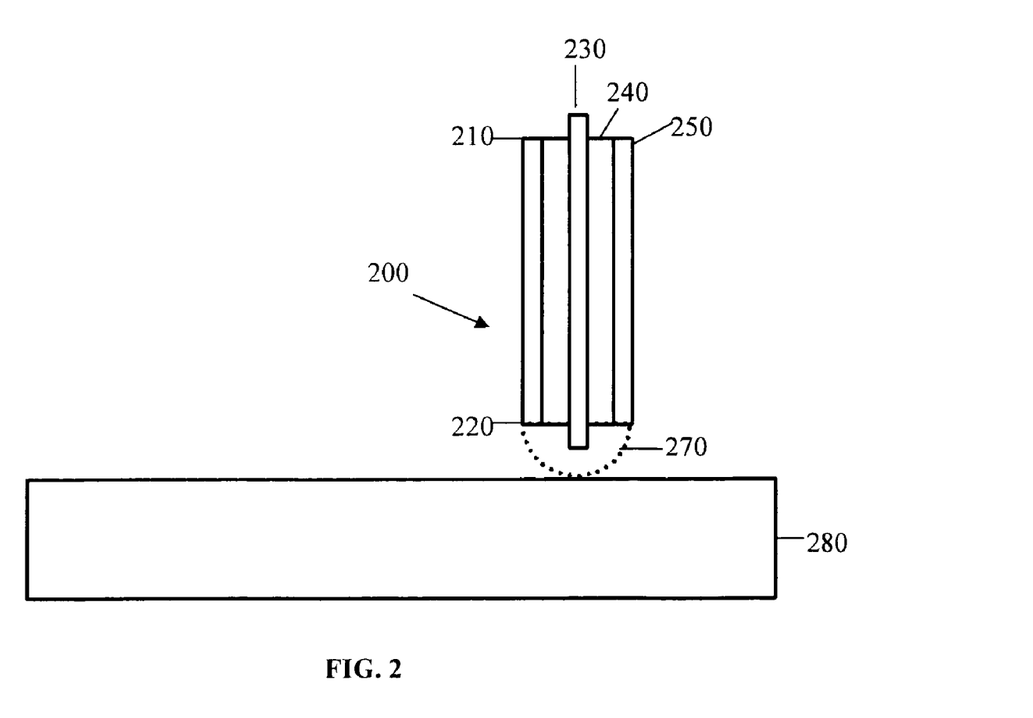
FIG. 2 shows a nanoscale optical probe in accordance with the presently disclosed embodiments.

FIG. 2 shows an embodiment of a nanoscale optical probe 200 synthesized in accordance with the presently disclosed embodiments. In the embodiment shown in FIG. 2, the nanoscale optical probe 200 is configured as a coplanar waveguide. In the coplanar configuration, at least two parallel planes are situated with a separation gap in the nanoscale regime, typically between about 10 nm to about 1000 nm. Electromagnetic radiation (an optical signal), in particular visible light in a transverse electromagnetic (TEM) mode, a transverse electric (TE) mode, or a transverse magnetic (TM) mode, is efficiently conveyed along the waveguide gap.

The nanoscale optical probe 200 has a tip surface 210 and a substrate surface 220. The nanoscale optical probe 200 has a metallic inner conductor 230 having a top end, a bottom end, and a body that is surrounded (on either side of the plane) by a dielectric or semiconducting material 240, which is surrounded (on either side of the plane) by a second metallic coating 250 (outer conductor). The inner conductor 230 is longer than the outer conductor 250, such that the inner conductor 230 protrudes out both the tip surface 210 and the substrate surface 220 of the nanoscale optical probe 200. The protruding ends of the inner conductor 230 act as nano-optical antennas and are capable of receiving (collecting), transmitting, and re-emitting an optical signal. Thus, matched coupling to the optical signal may be achieved improving the sensitivity of an optical microscope. Examples of dielectric coatings 240 include, but are not limited to/any dielectric material of high optical transparency such as ceramic materials: aluminum oxide ($Al_2O_3$) or silicon oxide ($SiO_x$, where $0 \leq x \leq 2$). In an embodiment, the dielectric or semiconducting material 240 is $Al_2O_3$. Examples of metallic coatings 250 include, but are not limited to aluminum (Al), copper (Cu), Gold (Au), or zinc (Zn). In an embodiment, the metallic coating 250 is aluminum.

In an embodiment, the inner conductor 230 has a width of about 2 nm to about 200 nm. In an embodiment, the dielectric material 240 has a thickness of about 10 nm to about 200 nm. In an embodiment, the outer conductor 250 has a thickness of about 10 nm to about 200 nm. A substrate 280 contains an object to be imaged. By scanning the end of the nanoscale optical probe 200, a magnified image of the object under study is collected. The nanoscale optical probe 200 will achieve resolutions of less than about 10 nm in a transverse direction, that being along a perpendicular line between the two planes comprising the nanoscale optical probe 200.

Because the width of the inner conductor 230 may be significantly smaller than the wavelength of visible light, which is in the range of about 300 nm to about 700 nm, the nanoscale optical probe 200 may be used to image objects with spatial resolution well under this range. Because the inner separation of the outer conductor 250 may also be nanoscale, and smaller than the wavelength of visible light, the nanoscale optical probe 200 may image objects with spatial resolution smaller than that of conventional near-field optical microscopes. The configuration of the nanoscale optical probe 200 serves to limit or cutoff the extent to which the sensitivity to near-field extends, independent of the wavelength of the light in cases where that wavelength exceeds the outer conductor 250 separation, by compressing the electromagnetic field into a volume defined by the size of the nanoscale optical probe 200. This cutoff/compression is further enhanced by having the inner conductor 230 be not flush, or blunt, at the substrate surface 220, but rather less-than-blunt, or under cut, such that the length at the substrate surface 220 is less than that of the dielectric 240 or the outer conductor 250. This will act to further restrict the spatial extend (especially in the vertical direction, toward the object) of the sensitivity to near electromagnetic fields, thus increasing the resolution by decreasing the area of object that constitutes one pixel. This provides a significant advantage over conventional NSOM probes, which have no such cutoff or field compression. In an embodiment, the inner conductor 230 size may be as small as a few nanometers, and the outer conductor 250 dimensions as small as about 10 nm. As in conventional NSOM, an object is imaged by scanning across the surface of the object, at a height of a few nanometers, where the sensitivity to near field light is highest.

The protruding antenna portion of the inner conductor 230 protruding from the substrate surface 220 enables the nanoscale optical probe 200 to be sensitive to far electromagnetic fields, similar to a conventional optical microscope. However, the spatial resolution of this nanoscale optical probe 200 exceeds that of a conventional microscope probe, and can approach the wavelength of the light illuminating the object, as this resolution is controlled again by the dimensions of the nanoscale optical probe 200. This resolution can be further controlled or changed by use of a lens 270 as indicated in FIG. 2. The lens 270 is transparent to an optical signal, or a range of wavelengths in an optical signal, and has an index of refraction that is different from that of the ambient environment near the object. In this manner, the electric field component of the electromagnetic field near the bottom end of the nano-optical antenna, within a volume of the lens 270, is enhanced relative to its magnitude in the absence of the lens 270. This has the effect of increasing the spatial resolution of the optical microscope by it being sensitive to lower levels of light or, conversely, to light incident from a smaller volume (or object surface area), and thus smaller pixel size. The enhancement in electric field due to the lens 270 is given by the ratio of the indices of refraction n of the lens 270 divided by that of the ambient. For example, if the ambient is air ($n_1=1$), and the lens 270 is titanium oxide ($TiO_2$, $n_2 \sim 2.5$), the field enhancement is about 2.5. This means that the spatial resolution of the nanoscale optical probe 200 is improved for a two-dimensional image by a factor of $n_2/n_1 = (2.5)^2 = 5.25$. In other words, the magnification resolution is improved by a factor of 5.

In both of the nanoscale optical probes depicted in FIGS. 1 and 2, an optical signal received at the substrate surface will be delivered to the carbon nanotube body, and will then propagate upward with high efficiency as a result of the electromagnetic properties of the nanoscale optical probes geometry. In an embodiment, the transverse electromagnetic (TEM) mode of electromagnetic radiation is efficiently propagated.

Figure 3:
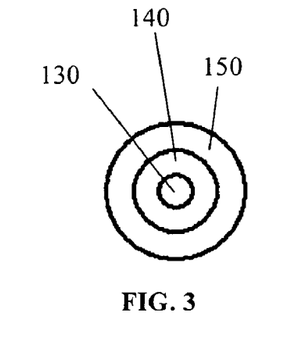
FIG. 3 shows a top view of the nanoscale optical probe of FIG. 1 in accordance with the presently disclosed embodiments.
Figure 4:
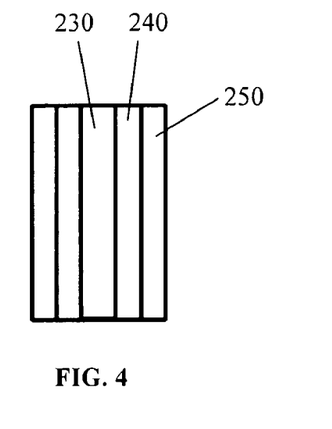
FIG. 4 shows a top view of the nanoscale optical probe of FIG. 2 in accordance with the presently disclosed embodiments.

FIG. 3 shows a top view of the nanoscale optical probe 100 of FIG. 1. FIG. 4 shows a top view of the nanoscale optical probe 200 of FIG. 2.

The nanoscale optical probes of the presently disclosed embodiments function as nanoscale optical microscopes, by having the ability to receive and transmit an optical signal with resolution smaller than the wavelength of the light. The primary electromagnetic mode in which the microscopes function is TEM, transverse electromagnetic. However, it is also capable of functioning via TM (transverse magnetic) and TE (transverse electric) modes, depending on the wavelength of the electromagnetic radiation (light) employed. The nanoscale optical probes of the presently disclosed embodiments may be used with sub-wavelength spatial resolution of near-field scanning optical microscope (NSOM) and nanometer resolution of atomic force microscope (AFM).

Figure 5:
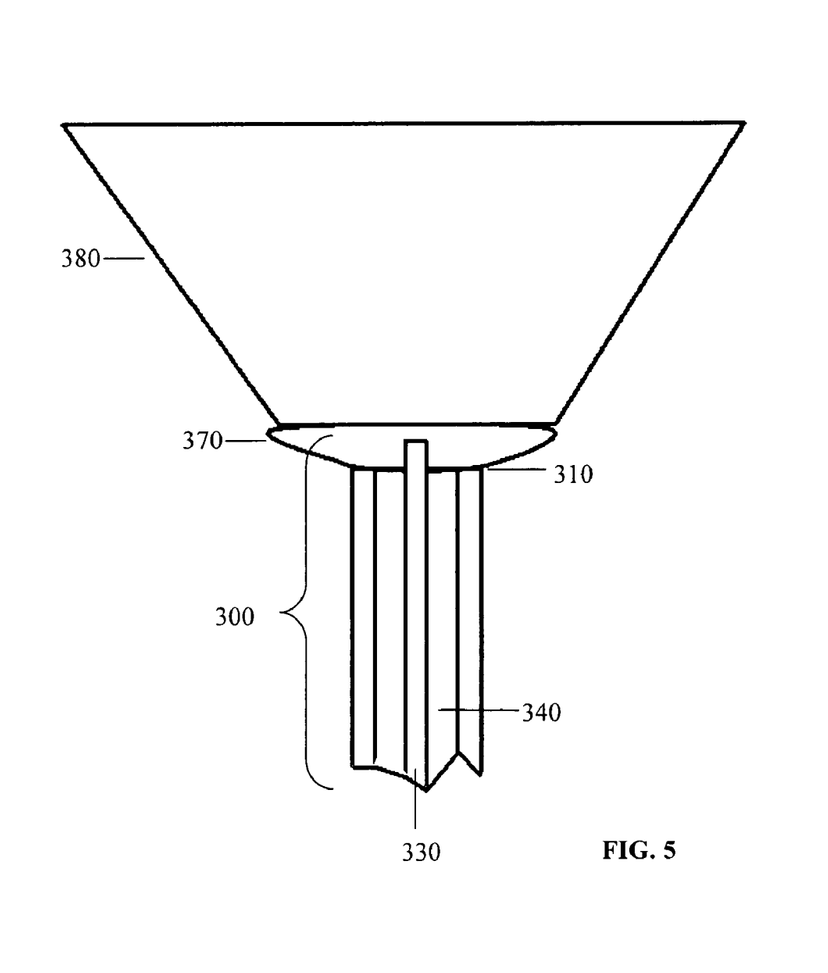
FIG. 5 shows the relevant positioning of a nanoscale optical probe of the presently disclosed embodiments with relation to a conventional macroscale optical probe. The nanoscale optical probe acts as an optical focusing and compressing tool enabling finer spatial resolution.

In an embodiment, a nanoscale optical probe 300 may be physically attached to a conventional tapered fiber tip 380, and acts as an optical focusing and compressing tool enabling finer spatial resolution, as shown in FIG. 5. That is, the mode of detection is predominantly optical (because even in conventional optical microscopy, the optical image of the object under study is routinely converted to a digital image using charged-coupled devices), and so becomes electronic as in conventional optical microscopy, including NSOM. In the embodiment shown in FIG. 5, a dielectric material 340 is transparent (in the wavelength range of interest range, e.g. visible). A macroscale optical probe 380, such as an optical fiber, is contacted to the nanoscale optical probe 300. This may be done with the aid of a transparent optical interface 370, such as a transparent polymer or epoxy. The nanoscale optical probe 300 collects electromagnetic radiation (an optical signal, light) from an object. The optical signal is transported up along the length of a carbon nanotube 330 body and is delivered to the optical interface 370 adjacent to a top surface 310 of the probe 300 and then to the macroscale optical probe 380. The geometry of the nanoscale optical probe 300 facilitates conveyance of electromagnetism in the TEM mode. In an embodiment where the substrate surface is blunt, such as that depicted in the nanoscale optical probe 100 of FIG. 1, there is no contradiction when considering that the blunt substrate surface collects only near-field light. This near-field light converts to TEM radiation along the nanoscale optical probe 100 structure, and emerges as far-field (conventional) light at the tip surface (at the optical interface) by virtue of having a nano-optical antenna. In an embodiment where the inner conductor protrudes from the substrate surface, such as that depicted in FIG. 2, it is far-field light throughout. The macroscale optical probe 380 transports the light delivered to it by means typical to conventional NSOM devices.

Figure 6:
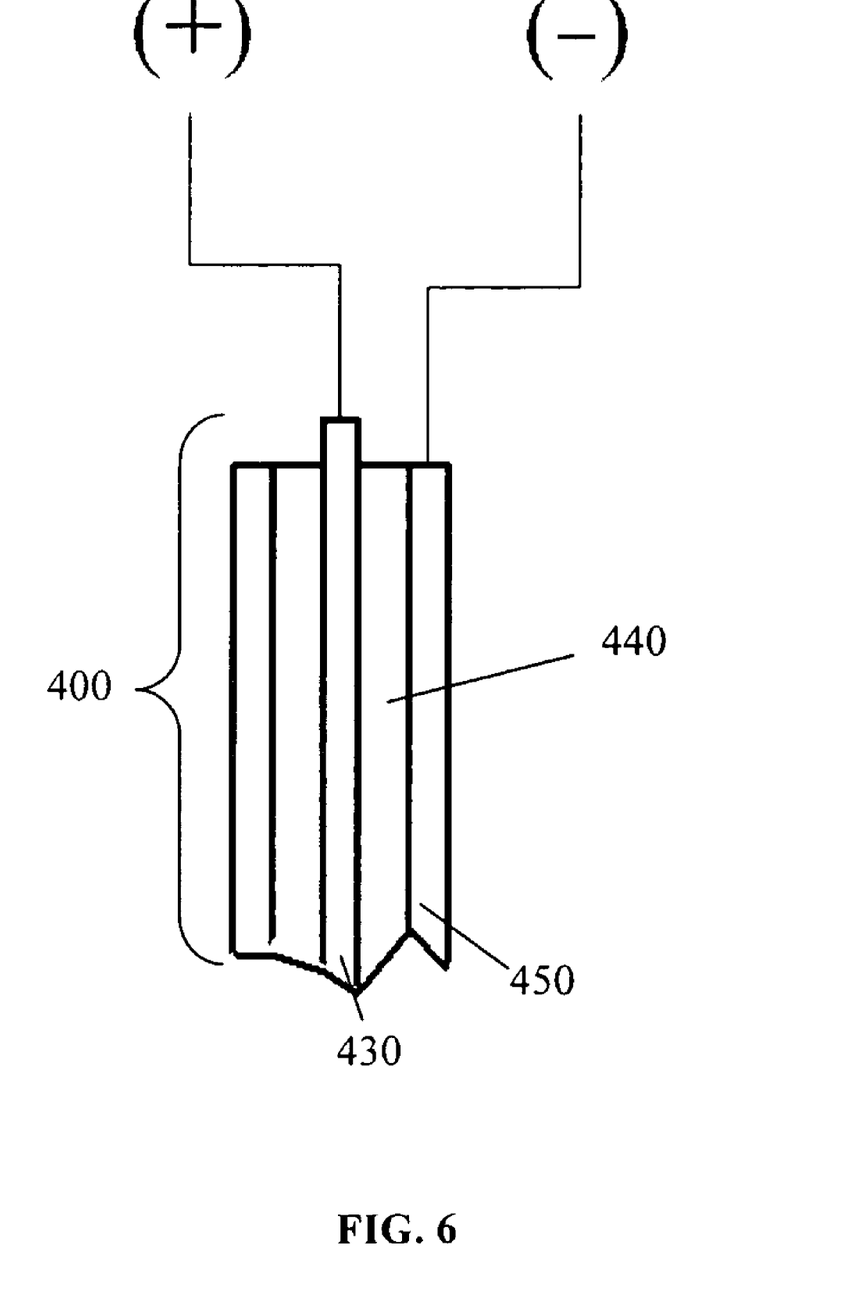
FIG. 6 shows a nanoscale optical probe of the presently disclosed embodiments. The nanoscale optical probe directly converts photons to electric current through the photovoltaic effect. That is, the nanoscale optical probe acts as a photon-to-electron converter.

In an embodiment, a conventional NSOM tapered fiber tip, as well as any and all optical components used to transmit the image light to a CCD or other detector, is replaced by an AFM-type (atomic force microscope) cantilever. Instead of transporting photons carrying the optical image information to a detector, the nanoscale optical probe directly converts the photons to electric current through the photovoltaic effect. That is, the nanoscale optical probe acts as a photon-to-electron converter, identically as in solar photovoltaics if a photovoltaic medium (such as silicon) is used as the dielectric. This embodiment has the advantage of dramatically simplifying the detection scheme and apparatus and may also eliminate information losses inherent in the conventional detection schemes and is shown in FIG. 6. In this embodiment, instead of a nanoscale optical probe 400 transporting the collected electromagnetic radiation (optical signal, light) along the length of a carbon nanotube 430 for delivery at the tip surface, the electric field component of the electromagnetic radiation causes photovoltaic action in a dielectric 440 region. That is, the light loses its energy to the generation of electron-hole pairs via the photovoltaic effect. Due to intrinsic Schottky junctions at the inner conductor-dielectric and dielectric-outer conductor interfaces, a built-in electric field exists, oriented radially between the carbon nanotube 430 and an outer conductor 450 in the case of the coaxial wire (nano-coax) waveguide probe, or between and perpendicular to the carbon nanotube 430 and the outer conductor 450 as in the coplanar waveguide probe. Free electrons generated in this process migrate toward the carbon nanotube 430 and the outer conductor 450, while free holes simultaneously generated migrate to the other electrode. If a complete electric circuit is formed by contacting electrodes to the carbon nanotube 430 and the outer conductor 450, the current flowing through this circuit when closed, or the voltage generated when open, can be used as measured of the intensity of light that enters the substrate surface of the nanoscale optical probe 400. In this manner, electrical sensing light microscopy is enabled, with nanoscale resolution.

Figure 7:
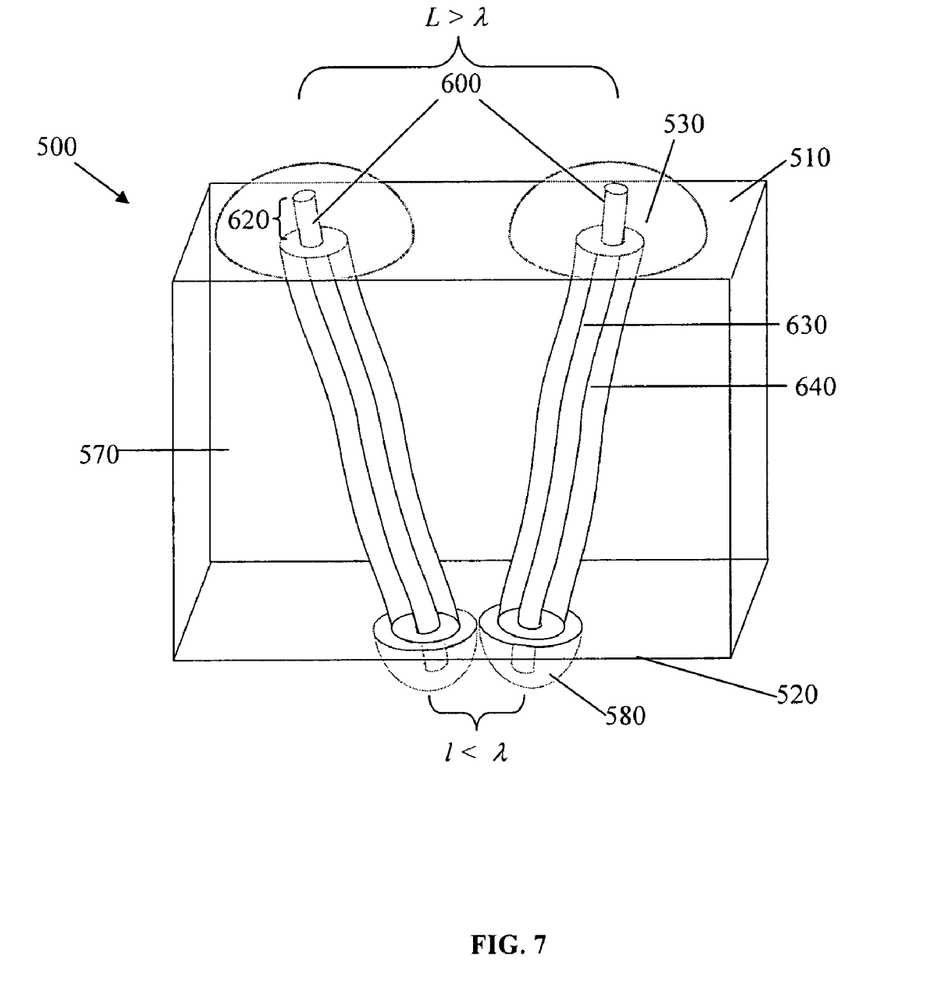
FIG. 7 shows a magnifying element having an array of nanoscale optical probes in accordance with the presently disclosed embodiments.

FIG. 7 shows a schematic image of a magnifying element 500 synthesized in accordance with the presently disclosed embodiments. The magnifying element 500 is a device that may be used in any conventional optical system. The magnifying element 500 works via nano-optics, where an array of nanoscale optical probes 600 penetrate an electrically conducting film 570 and connect receiving pixels (lenses) 580 on a bottom surface 520 with emitting pixels 530 on a top surface 510. The magnifying element 500 allows light transport only through the nanoscale optical probes 600 and related pixels, thus the surrounding film 570 is non-transparent and does not allow light propagation. The array of small receiving pixels (lenses) 580 (subwavelength size) fabricated from a luminescent or other light scattering/diffusive material, exists on the bottom surface 520 of the magnifying element 500, and the corresponding array of pixels 530 (with diameter equal to about a wavelength of incoming radiation) on the top surface 510 of the magnifying element 500. Each receiving pixel 580 on the bottom surface 520 is connected to the emitting pixel 530 on the top surface 510 via the nanoscale optical probes 600. In an embodiment, the nanoscale optical probe 600 has a carbon nanotube 630 (inner conductor) having a top end, a bottom end, and a body that is cylindrically (circumferentially) surrounded by a dielectric or semiconducting material 640, which is cylindrically (circumferentially) surrounded by a second metallic coating (outer metal conductor). The top end and the bottom end of the carbon nanotube 630 act as nano-optical antennas and are capable of receiving (collecting), transmitting, and re-emitting an optical signal. In an embodiment, the nanoscale optical probe 600 is built of the carbon nanotube 630 surrounded by the transparent dielectric coating 640. Examples of dielectric coatings 640 include, but are not limited to/any dielectric material of high optical transparency such as ceramic materials: aluminum oxide ($Al_2O_3$) or silicon oxide ($SiO_x$, where $0 \leq x \leq 2$), and polymers: polystyrene (PS) or polymethyl metacrylate (PMMA). The layout presented in FIG. 7 assumes the surrounding film 570 to be non-transparent and metallic. The surrounding film 570 is also the outer electrode for the magnifying element 500, thus metallic properties are necessary.

The receiving pixels 580 collect light that is impinging on them and transfers the light toward the entrance of the nanoscale optical probes 600 via the inner conductors 630, which act as nano-optical antennas 620 at the bottom surface 520.

The receiving pixels 580 collect light and should not be completely transparent, otherwise the light would remain in the nano-optical antenna.

An image of an object placed below magnifying element 500 is projected from the top surface 510, for example using conventional optical microscopy. The averaged electric field in a receiving pixel 580 excites the nano-optical antenna 620 of the nanoscale optical probe 600, and light is transmitted up to the top surface 510 through the inner conductor 630, and subsequently is re-emitted into the emitting pixel 530 on the top surface 510 via the nano-optical antenna 620 on the top surface 510. The magnifying element 500 design assures a geometrical convergence of the nanoscale optical probes 600 on the bottom surface 520, so that the inter-pixel separation l, on the bottom surface 520, is smaller than that L on the top surface 510. Geometrical convergence of the magnifying element 500 assures that all dimensions of the features on the top surface 510, such as emitting pixel 530 diameter and inter-pixel spacing L, are represented by the same kind of features on the bottom surface 520 but scaled down, with proportions constrained, by a certain factor. An image projected onto the bottom surface 520 of the magnifying element 500, is magnified in size by a factor of L/l on the top surface 510. Those skilled in the art will recognize that only two nanoscale optical probes 600 are depicted in FIG. 7, and an array including a larger number of probes is within the spirit and scope of the present invention.

In the embodiment shown in FIG. 7, pixels on both surfaces are directly wired through appropriate carbon nanotubes 630. The light-receiving pixels 580 on the bottom surface 520 will capture light and transfer it through the body of the carbon nanotubes 630 to the corresponding emitting pixels 530 on the top surface 510. The top surface 510 is therefore a direct map of the bottom surface 520 but in a different scale (i.e. larger). The direct wiring may be done using straight, linear carbon nanotubes shown in FIG. 7 or non-straight, non-linear carbon nanotubes (not shown).

Figure 8:
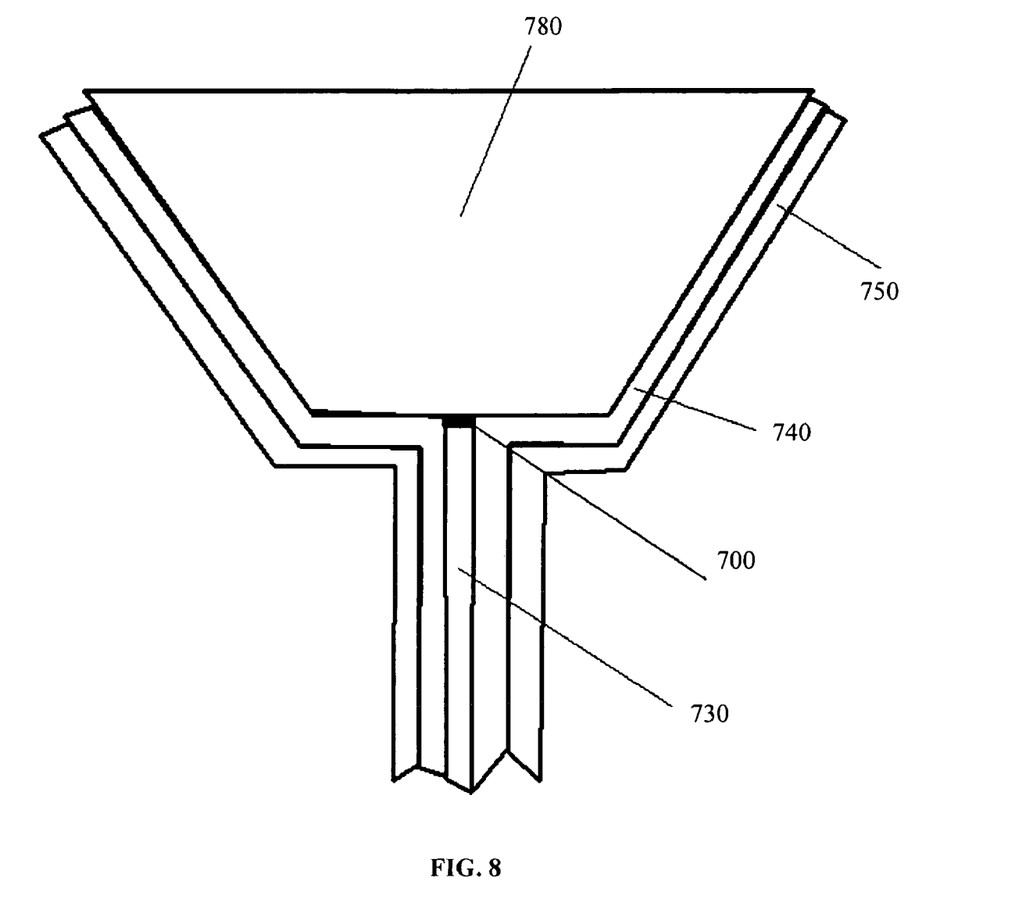
FIG. 8 shows the fabrication of a nanoscale optical probe of the presently disclosed embodiments.

FIG. 8 shows an exemplary setup for synthesizing a nanoscale optical probe having a coaxial wire waveguide configuration of the presently disclosed embodiments. A nanoscale optical probe for optical detection can be fabricated at the end of an optical fiber 780. A carbon nanotube catalytic transition metal 700 (for example nickel) is electrodeposited onto the end of the tapered optical fiber 780, followed by carbon nanotube 730 growth. Plasma enhanced chemical vapor deposition (PECVD) is used to grow the carbon nanotube 730. A dielectric (or semiconductor) material 740 (for example $SiO_x$, where $0 \leq x \leq 2$, or $Al_2O_3$) is deposited over the carbon nanotube 730 (for example, via PECVD, sputtering, or evaporation). Typically, the dielectric material 740 is coated to yield a thickness of about 10 nm to about 200 nm. An outer metal 750 (for example, aluminum) is then deposited (via CVD, sputtering or evaporation) over the dielectric material 740, forming a nanoscale optical probe having a coaxial wire waveguide configuration.

In order to fabricate a nanoscale optical probe of the presently disclosed embodiments having a coplanar waveguide configuration, the optical fiber 780 may be replaced with an AFM-type tip. A carbon nanotube catalytic transition metal (for example nickel) is electrodeposited onto the end of an AFM-type tip, followed by carbon nanotube growth. Plasma enhanced chemical vapor deposition (PECVD) is used grow the carbon nanotube. A dielectric photovoltaic material having both electrical conductivity and transparency (for example silicon- and non-silicon-based materials) is deposited over the carbon nanotube via (for example, via PECVD, sputtering, or evaporation). Typically, the dielectric material is coated to yield a thickness of about 10 nm to about 200 nm. An outer metal (for example, aluminum) is then deposited (via CVD, sputtering or evaporation) over the dielectric material, forming a nanoscale optical probe having a coplanar waveguide configuration. If desired, the outer metal may be removed from the bottom surface of the probe (via focused ion beam or wet etch), thus exposing the photovoltaic material and the carbon nanotube, yielding a nano-optical antenna at the substrate surface of the probe.

All patents, patent applications, and published references cited herein are hereby incorporated by reference in their entirety. It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A nanoscale coaxial optical probe comprising:
    a inner conductor having a top end, a bottom end, and a body;
    a dielectric material engaging the inner conductor; and
    an outer conductor engaging the dielectric material,
    wherein the inner conductor is longer at a tip surface of the probe than the dielectric material and the outer conductor; and
    wherein a diameter of the inner conductor and a diameter of the outer conductor are smaller than an optical signal wavelength.

2. The nanoscale coaxial optical probe of claim 1 wherein the top end and the bottom end of the inner conductor act as nano-optical antennas for receiving and transmitting an optical signal.

3. The nanoscale coaxial optical probe of claim 1 wherein the inner conductor is a carbon nanotube.

4. The nanoscale coaxial optical probe of claim 1 wherein the inner conductor is a nanowire.

5. The nanoscale coaxial optical probe of claim 1 wherein the dielectric material is photovoltaic.

6. The nanoscale coaxial optical probe of claim 1 wherein the dielectric material circumferentially surrounds a portion of the inner conductor and the outer conductor circumferentially surrounds a portion of the dielectric material.

7. The nanoscale coaxial optical probe of claim 1 wherein a top end of the nanoscale coaxial optical probe engages a fiber tip of a near-field scanning optical microscope.

8. The nanoscale coaxial optical probe of claim 1 wherein the probe converts photons from an optical signal into an electric current through a photovoltaic effect.

9. A magnifying element for use with a near-field scanning optical microscope comprising:
    a film having a top surface, a bottom surface and a plurality of cylindrical channels; and
    an array of nanoscale optical probes converging through the film in the plurality of cylindrical channels, wherein each nanoscale optical probe comprises:
    an inner nanowire having a top end, a bottom end, and a body;
    a dielectric material engaging the inner nanowire; and
    an outer metal material engaging the dielectric material,
    wherein each nanowire connects a light-emitting pixel on the top surface of the film with a corresponding light-receiving pixel on the bottom surface of the film.

10. The magnifying element of claim 9 wherein the top end of each nanowire extends beyond the top surface of the film, the body is embedded within the film, and the bottom end extends beyond the bottom surface of the film.

11. The magnifying element of claim 10 wherein the portion that extends beyond the top surface of the film and the bottom surface of the film act as nano-optical antennas for receiving and transmitting an optical signal.

12. The magnifying element of claim 11 wherein the nano-optical antennas on the bottom surface of the film compresses the optical signal into nanoscopic dimensions.

13. The magnifying element of claim 10 wherein the portion that is embedded within the film converts electromagnetic energy collected by the nano-optical antenna on the bottom surface of the film into a transverse electromagnetic (TEM) mode as a manageable signal and allows for propagation of the TEM mode with a wavelength exceeding a perpendicular dimension of the nanowire.

14. The magnifying element of claim 9 wherein the film is non-transparent.

15. The magnifying element of claim 9 wherein light from an optical signal is collected by the receiving pixel on the bottom surface of the film which excites the nano-optical antenna on the bottom surface of the film to transmit the light through the nano-coaxial transmission line to the nano-optical antenna on the top surface of the film and re-emit the light into the light-emitting pixel.

16. A nanoscale coaxial optical probe comprising:
a inner conductor having a top end, a bottom end, and a body;
a dielectric material engaging the inner conductor; and
an outer conductor engaging the dielectric material,
wherein the inner conductor is longer at a tip surface of the probe than the dielectric material and the outer conductor; and
wherein the probe converts photons from an optical signal into an electric current through a photovoltaic effect.

17. The nanoscale coaxial optical probe of claim 16 wherein a diameter of the inner conductor and a diameter of the outer conductor are smaller than an optical signal wavelength.

18. The nanoscale coaxial optical probe of claim 16 wherein the dielectric material circumferentially surrounds a portion of the inner conductor and the outer conductor circumferentially surrounds a portion of the dielectric material.

19. The nanoscale coaxial optical probe of claim 16 wherein the top end and the bottom end of the inner conductor act as nano-optical antennas for receiving and transmitting an optical signal.

20. The nanoscale coaxial optical probe of claim 16 wherein the dielectric material is photovoltaic.

* * * * *